US 6,566,218 B2

United States Patent
Otani et al.

(10) Patent No.: US 6,566,218 B2
(45) Date of Patent: May 20, 2003

(54) BORIDE-BASED SUBSTRATE FOR GROWING SEMICONDUCTING LAYERS THEREON AND A SEMICONDUCTOR DEVICE USING THE SAME

(75) Inventors: Shigeki Otani, Tsukuba (JP); Jun Suda, Kyoto (JP); Hiroyuki Kinoshita, Yokaichi (JP)

(73) Assignees: National Institute for Materials Science, Ibaraki (JP); Kyocera Corporation, Kyoto (JP)

( * ) Notice: Subject to any disclaimer, the term of this patent is extended or adjusted under 35 U.S.C. 154(b) by 0 days.

(21) Appl. No.: 09/917,600

(22) Filed: Jul. 27, 2001

(65) Prior Publication Data

US 2002/0038892 A1 Apr. 4, 2002

(30) Foreign Application Priority Data

Jul. 28, 2000 (JP) ........................................ 2000-228903

(51) Int. Cl.[7] .......................... H01L 21/20; H01L 21/31; H01L 33/00
(52) U.S. Cl. ...................... 438/384; 438/791; 438/393; 257/99; 257/97; 257/102; 257/101; 257/194; 257/79
(58) Field of Search .............................. 438/384, 393, 438/89, 166, 46, 300, 21, 128, 459, 791; 257/347, 181, 182, 352, 76, 190, 3, 77, 627, 94, 103, 613, 13, 96, 79, 99, 194

(56) References Cited

U.S. PATENT DOCUMENTS

| 5,225,275 A | * | 7/1993 | Aida ........................... 428/334 |
| 2002/0081463 A1 | * | 6/2002 | Shabita et al. ............... 428/698 |
| 2002/0104998 A1 | * | 8/2002 | Hori et al. ..................... 257/79 |
| 2002/0105004 A1 | * | 8/2002 | Hori et al. ..................... 257/99 |
| 2002/0113249 A1 | * | 8/2002 | Hori et al. ................... 257/194 |
| 2002/0117961 A1 | * | 8/2002 | Hori et al. ................... 313/498 |
| 2002/0123246 A1 | * | 9/2002 | Asai et al. ................... 438/791 |
| 2002/0125491 A1 | * | 9/2002 | Shabita et al. ................ 257/94 |
| 2002/0149028 A1 | * | 10/2002 | Hori et al. ................... 257/102 |
| 2002/0175389 A1 | * | 11/2002 | Shibata et al. .............. 257/458 |
| 2002/0190275 A1 | * | 12/2002 | Shibata et al. .............. 257/200 |

FOREIGN PATENT DOCUMENTS

| JP | 04-321280 | 11/1992 | |
| JP | 406192836 A | * 7/1994 | ........... H01L/31/04 |

OTHER PUBLICATIONS

Milenin et al.—Stability of TiN–GaAs and TiB2–GaAs contacts, ASDM '98, pp. 263–266.*

* cited by examiner

Primary Examiner—Matthew Smith
Assistant Examiner—Igwe U. Anya
(74) Attorney, Agent, or Firm—Hogan & Hartson, LLP

(57) ABSTRACT

A substrate for forming a semiconducting layer is provided to grow the semiconducting layer on a major surface thereof, wherein the substrate comprises a single crystal of a chemical formula of $XB_2$ where X contains one of Ti and Zr and the major surface may preferably be substantially parallel to plane (0001) of the single crystal because the plane (0001) of the boride substrate is highly coherent to the lattices of GaN and AlN layers grown eptaxially on the substrate. The single crystal of the substrate may be a solid solution containing impurities of not more than 5%, wherein at least one of the impurities is one selected from Cr, Hf, V, Ta and Nb. Further, a semiconductor device includes the substrate of a single crystal of a chemical formula of $XB_2$ and at least one semiconducting layer which is grown epitaxially on the substrate, the semiconducting layer including a nitride semiconductor of a chemical formula of ZN where Z is one of gallium, aluminum and indium and boron. The device can be used for a light emission diode in which one or more connection electrodes are attached on the substrate.

10 Claims, 4 Drawing Sheets

- 40. p-Electrode
- 12. p-GaN Layer
- 13. p-AlGaN Clad Layer
- 14. InGaN Emission Layer
- 15. n-AlGaN Clad Layer
- 16. n-GaN Layer
- 11. GaN Buffer Layer
- 30. $ZrB_2$ Substrate Fig.1A
Fig.1B
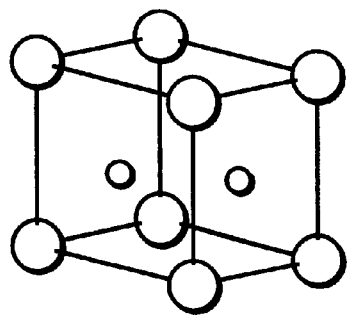 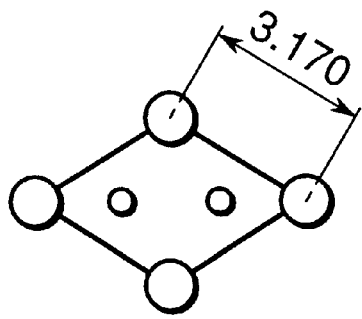 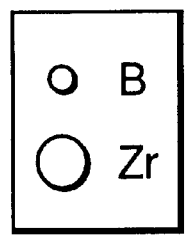
Fig.2A
Fig.2B
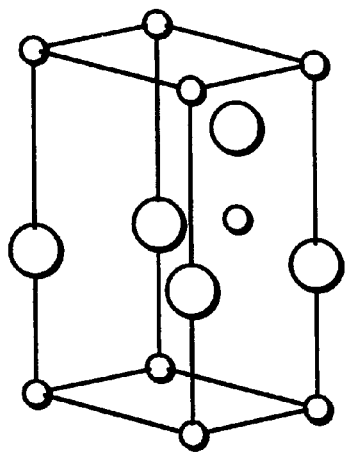 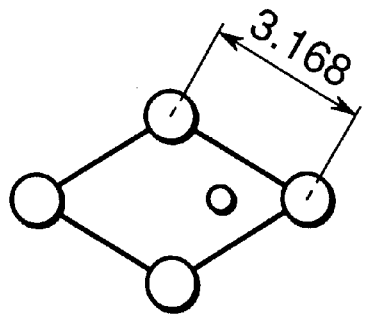 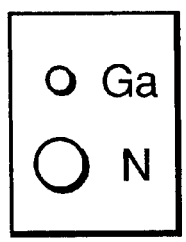

- 10. GaN Growth Layer
- 11. GaN Buffer Layer
- 30. ZrB$_2$ Substrate

- 40. p-Electrode
- 12. p-GaN Layer
- 13. p-AlGaN Clad Layer
- 14. InGaN Emission Layer
- 15. n-AlGaN Clad Layer
- 16. n-GaN Layer
- 11. GaN Buffer Layer
- 30. $ZrB_2$ Substrate

- 40. p-Electrode
- 12. p-GaN Layer
- 13. p-AlGaN Clad Layer
- 14. InGaN Emission Layer
- 15. n-AlGaN Clad Layer
- 41. n-Electrode
- 16. n-GaN Layer
- 11. GaN Buffer Layer
- 20. Sapphire Substrate

BORIDE-BASED SUBSTRATE FOR GROWING SEMICONDUCTING LAYERS THEREON AND A SEMICONDUCTOR DEVICE USING THE SAME

BACKGROUND OF THE INVENTION

1. Field of the Invention

The present invention relates to a boride-based substrate for forming semiconducting layers thereon to be used for a semiconductor device, and to a semiconductor device using the boride-based substrate.

2. Prior Art

Gallium nitride based semiconductors have been used for devices for emitting blue to violet rays such as light emission diodes and laser emitting semiconductor devices, and also have been noticed as electron controlling devices having wider energy gaps than silicon and gallium arsenide semiconductors.

In the light emission diodes as examples of conventional semiconductor devices making use of gallium nitride layers, the layers have been formed on the surface for a substrate made of a sapphire crystal, as described in Japanese Patent Publication No. A 4-321280.

FIG. 8 shows a prior art structure of a light emission diode, in which, on a sapphire substrate 20 is formed a GaN buffer layer 11 on which a GaN-grown multilayer is laminated including, in turn, an n-GaN layer 16, an n-AlGaN clad layer 15, an InGaN emission layer 14, a p-AlGaN clad layer 12 and a p-GaN layer 12.

The grown multilayer including p-GaN layer 12 to n-GaN layer 16 is partially cut by etching to expose an upper surface of n-GaN layer 16 on which an n-type electrode 41 is attached, where a p-type unipolar electrode 40 is connected on the top surface of p-GaN layer 12 as a uppermost layer. This type of light emission diode is referred to as lateral type.

Since a single perfect crystal for use of substrates is difficult to be made of GaN, some methods of preparing perfect single crystals containing other substance than GaN have been considered to grow GaN semiconducting layers effectively thereon. For example, proposals have been made to use plane (0001) of spinel $MgO \cdot Al_2O_3$ or silicon carbide such as 6H— or 4H—SiC for growing semiconducting layers.

Growth of GaN-based semiconducting layers has usually been achieved by using sapphire crystals. A buffer layer had to be formed previously of AlN or GaN in the amorphous form on the particular plane of the sapphire substrate because no single crystal layer of GaN having few defects can be formed directly on the sapphire crystal due to a considerably large lattice constant differential between an $Al_2O_3$ crystal and a GaN crystal.

The lattice of a substrate crystal must match with a GaN or AlN layer to be epitaxially grown thereon to form a perfectly single crystal layer. For the lattice constants of GaN and $Al_2O_3$, a reference length, on plane (0001), of sapphire corresponding to the lattice constant of GaN or AlN is 1/1.73 times as long as an a-axis lattice length of a unit lattice cell of sapphire because the GaN or AlN crystal is grown rotating its a-axis by 30° to the a-axis of the sapphire unit cell on its plane (0001). The lattice constant a of sapphire is a=4.7580 Å, then the reference length of sapphire being estimated 2.747 Å. On the contrary, GaN and AlN have a lattice constant of 3.168 Å and 3.186 Å, respectively, then having a percentage of lattice mismatch rate of +15.98% and +13.27%, respectively, which is a ratio of the differential of the nitrides lattice constant from the reference length divided the reference length. The lattice constant of sapphire is excessively larger than that of GaN and AlN from point of view of lattice coherency required for epitaxial growth. This is a reason for preparing a buffer layer on the plane (0001), i.e., the major surface of the substrate, prior to forming GaN crystal layers. Such a buffer layer serves to relax the lattice mismatch between the GaN or AlN layer and the substrate.

However, the GaN grown layers formed on the buffer layer have often included numerous lattice defects, particularly dislocations, which often reach a larger lattice defect density in a range of $10^7$–$10^{11}$ cm$^{-1}$, compared to $10^2$–$10^7$ cm$^{-1}$ of the defect density in some GaAs-based semiconducting layer on a GaAs-based semiconducting substrate.

The presence of numerous lattice defects in the GaN grown layers has limited property performance of the produced semiconductor devices and the GaN layers have been required to increase in impurities to be contained therein to emit more carriers. However, this results in further increase in lattice defects created in the semiconducting layers, then deteriorating light emission semiconductor device in all quality performance including parameters such as useful lifetime, withstand voltage, driving voltage, consumable power or power efficiency, operating speed and current leakage.

There was another problem that no electrode was provided for any surface of a sapphire substrate to connect the semiconducting layers in the device to an outer circuit because sapphire is an electrically insulating material having no conductivity across the substrate. By this reason, it was required to provide a unipolar electrode on any conductive or semiconducting layer over a substrate, resulting in limited disposition of electrodes in the device. In the case shown in FIG. 8, an n-type unipolar electrode 41 for connection is attached on a surface of a lower semiconducting layer, e.g., n-GaN layer 16, and accordingly n-GaN layer 16 must previously be provided with a surface by removing partially the layers including p-GaN layer 12 to the n-GaN layer 16 by an etching process. However, thickness of the n-GaN layer 16 whose surface is used for attaching the electrode 41 is not easily controlled to be uniform in the etching process, leading to complicated production processes and low product yield A sapphire substrate does not efficiently radiate out heat created in the semiconductor device due to its low thermal conductivity, which causes the device to increase in operating temperature, then to decrease in useful life time. This problem was required to be solved by particular measures for promoting heat radiation from the substrate.

There was another problem due to a thermal expansion differential between a sapphire substrate and a GaN— or AlN-buffer layer, having rather large difference in thermal compression coefficient. In general, the GaN layer gets grown on the surface of a sapphire substrate at a temperature higher than 1000° C. During cooling the layer together with the substrate from such a high growth temperature to room temperature, the substrate is contracted so as to form a compression stress in the grown GaN-layer due to a significant difference in thermal compression coefficient between the layer and the substrate, causing residual stress in the GaN layer to increase the density of dislocations and other crystal defects.

SUMMARY OF THE INVENTION

An object of the present invention is to provide a substrate for growing directly a semiconducting nitride layer thereon with sufficiently low density of lattice defects in the layer, by approaching the lattice constant of the substrate to that of the nitride layer.

Another object of the present invention is to provide a substrate for growing a semiconducting nitride layer, which substrate has an electric conductivity high enough to form a connecting electrode directly on the front or rear face of the substrate.

Further another object of the present invention is to provide a substrate having high thermal conductivity to effectively radiate heat produced in a semiconductor device formed on the substrate.

Still another object of the present invention is to provide a substrate for growing a semiconducting layer wherein the substrate has a thermal expansion coefficient less different from that of the semiconducting nitride layer to be formed to prevent a residual stress from creating between the substrate and the layer.

Further still another object of the present invention is to provide a semiconductor device using such a substrate which can provide excellent quality performances of high heat radiation and formation of electrodes on the substrate.

In the present invention, a substrate for growing a semiconducting nitride layer comprises a single crystal of a boride having chemical formula $XB_2$ where X is Ti or Zr. The crystal of the boride $XB_2$ has a principal plane (0001), expressed by hexagonal indices, which can be used for a major surface of a substrate on which to grow the layers of a nitride, and has a lattice constant highly coherent in the plane (0001) to that of the nitride, particularly, of gallium Ga, aluminum Al, indium In or boron B.

The present invention includes a semiconductor device comprising the above-mentioned substrate of a boride having chemical formula $XB_2$ where X is Ti or Z and at least one semiconducting layer formed on the substrate, wherein the semiconducting layer includes a nitride semiconductor of a chemical formula of ZN where Z is one of gallium, aluminum and indium and boron.

On the boride $XB_2$ substrate a single crystal layer of the nitride semiconductor can easily be grown epitaxially in very low level of lattice defect density. The plane (0001) of the $XB_2$ substrate has high coherency with respect to the lattice of the single crystalline nitride layer at the interface of both crystals. This reduces the lattice strain in the nitride layer, and then, reduces the amount of dislocations to be induced during growth.

In the present invention, an epitaxially grown nitride layer may be formed directly (i.e., without using any buffer layer) from the substrate surface, and further semiconducting nitride layers may be laminated in turns on the first nitride layer by epitaxial growth steps on the directly grown nitride layer. The direct growth of a semiconducting nitride layer on the substrate can provide advantages of high crystallinity and very low density of lattice defects in the laminated semiconducting nitride layers to improve the above various properties needed for semiconductor devices.

The boride including Ti or Zr in the present invention has a high electric conductivity. It is advantageous that the boride substrate can be used to attach a connecting electrode directly thereon when it is used as a substrate for fabricating a semiconductor device.

The boride including Ti or Zr in the present invention has a relatively high thermal conductivity, then providing another advantage of enhancing the heat radiation created in the semiconductor device from the substrate effectively.

The boride including Ti or Zr has a thermal expansion coefficient close enough to that of the nitrides of Ga or Al to reduce occurrence of residual thermal stress between a boride substrate and a nitride layer, which considerably avoids introducing dislocations into the semiconducting nitride layers during the thermal process, and provides thermally stable performance for the semiconductor device for a long time.

BRIEF DESCRIPTION OF THE DRAWINGS

The present invention will be explained in further detail below with reference to the accompanying drawings, in which:

FIG. 1A shows an atomic configuration ($AlB_2$ type structure) in a unit cell of a $XB_2$ compound crystal;

FIG. 1B shows a top view of the unit cell of a $ZrB_2$ crystal viewed perpendicular to a rhombic plane of the unit cell shown in FIG. 1A;

FIG. 2A shows an atomic configuration (wurtzite type structure) of a unit cell of a GaN crystal;

FIG. 2B shows a top view of a GaN crystal viewed perpendicular to a rhombic plane of the unit cell shown in FIG. 2A;

THE DETAILED DESCRIPTION OF THE INVENTION

Figure 3:
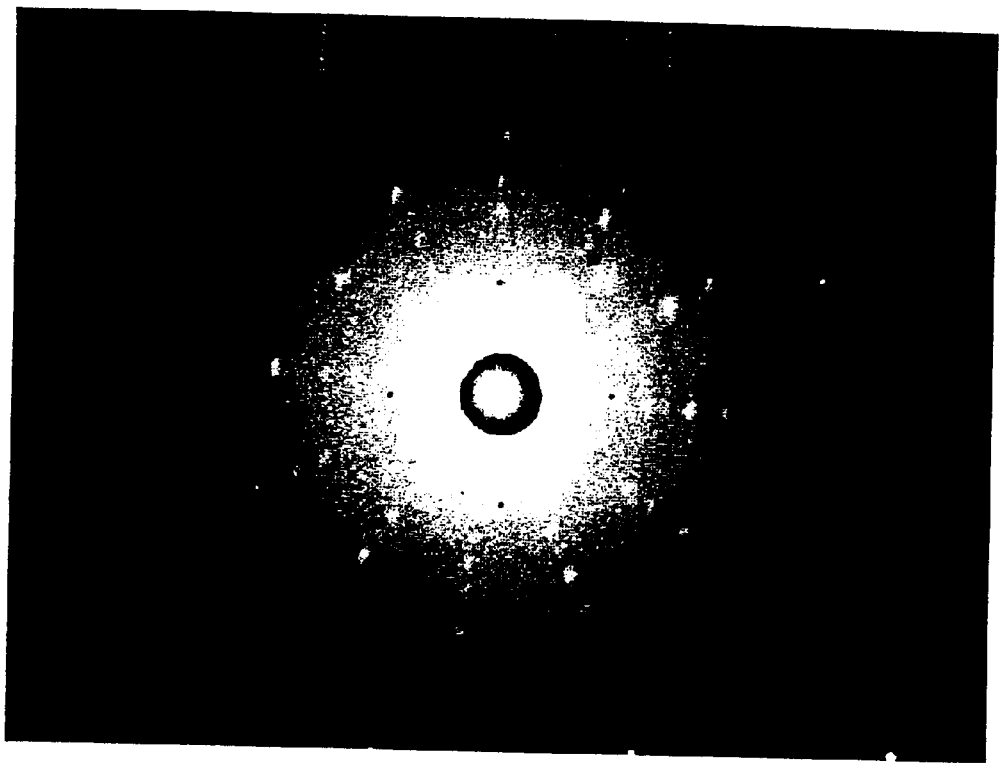
FIG. 3 shows a Laue diagram of X rays diffracted by plane (0001) of a $ZrB_2$ crystal.

The substrate of the present invention includes a single crystal of a boride expressed by $XB_2$ where X is Ti or Zr, and B is boron. $XB_2$ may include $TiB_2$, $ZrB_2$ or their solid solution (Ti, Zr)$B_2$. The crystal structure of these $XB_2$ compounds have a hexagonal structure referred to as $AlB_2$ structure shown in FIG. 1A, which is similar to wurtzite structure of a GaN crystal shown in FIG. 2A.

X in the formula $XB_2$ may contain small amounts of impurities, capable of dissolving in the $XB_2$ crystal, such as Hf, V, Nb, Ta, Cr. The total amounts of the impurities preferably are not more than 5 mol % based on total X components. The impurities of an amount exceeding 5 mol % have a risk of varying the excellent characteristics of the $XB_2$ material as will be explained later.

The substrate of the present invention can use crystal plans (0001), (01$\bar{1}$0), (1$\bar{1}$20) and (01$\bar{1}$2), expressed in the hexagonal indices, of the $XB_2$ crystal containing Ti or Zr for a major surface on which to grow the semiconducting nitride layer of GaN, AlN, InN and BN. Particularly, plane (0001)

is desirable for growth of the nitride layer with small lattice defects. The major surface of the substrate polished parallel to plan (0001) may preferably be used for the formation of the growth layers of GaN and AlN crystals or mixed crystal thereof because of the high coherency of the plane (0001) to the lattice of GaN and AlN crystals.

As will be explained in a methods of the later Example, the lattice constants of $XB_2$ crystals were determined by using samples produced of $TiB_2$ and $ZrB_2$. Table 1 lists the newly determined lattice constants of borides $ZrB_2$ and $TiB_2$, with together the date of alumina $Al_2O_3$, and nitride compounds GaN and AlN. A lattice constant is defined as a length of a side of the rhombic plane on a sectional-rhomboid cylinder, a unit cell, of the borides and the nitrides, as shown in FIGS. 1B and 2B, respectively, wherein the rhombic plane corresponding to plane (0001).

TABLE 1

| | Lattice Constant Å |
|---|---|
| $ZrB_2$ | 3.1696 |
| $TiB_2$ | 3.0303 |
| $Al_2O_3$ | a1 = 4.7580 |
| | a2 = 2.747 |
| GaN | 3.186 |
| AlN | 3.1114 |

Table 2 shows data of lattice coherency of one of GaN and AlN to one of $TiB_2$, $ZrB_2$ and alumina. It is from this Table found that $TiB_2$ and $ZrB_2$ exhibit higher coherency to the Nitrides of Ga and Al than sapphire does. Particularly, $ZrB_2$ is very highly coherent to either of GaN and AlN within a range of 2% of the differential of the lattice constants between the boride and the nitride.

TABLE 2

| | $Al_2O_3$ | $ZrB_2$ | $TiB_2$ |
|---|---|---|---|
| lattice incoherency rate to GaN (%) | 15.98 | −0.51 | −4.89 |
| lattice incoherency rate to AlN (%) | 13.26 | 1.87 | −2.61 |
| thermal conductivity (Cal/cm · sec · ° C.) | 0.10 | 0.32 | 0.18 |
| thermal expansion differential to GaN (%) | 3.2 | 2.7 | 1.1 |
| specific resistance ($\mu\Omega$ · cm) | >$10^{10}$ | 17 | 9 |

The semiconductor device of the present invention includes a substrate formed of $TiB_2$, $ZrB_2$, or their solid solution, and at least one semiconducting layer formed of nitride of at least one of gallium, aluminum, indium and boron which is epitaxially grown on the substrate. The semiconducting nitride layers have high coherency to Plane (0001) on the surface of the boride substrate, and accordingly, can have high crystallinity with very low density of lattice defects such as dislocations.

As shown in Table 2, the substrate of the present invention shows the feature that the boride $XB_2$ crystal has the thermal expansion coefficient close to that of the nitride of gallium and aluminum, with a smaller differential of the thermal expansion coefficients between the boride $XB_2$ substrate and the nitride layer, compared to the conventional sapphire substrate. Therefore, during cooling process after the GaN layer growth, a strain applied to the nitride layer in the direction along plane (0001) may be kept much lower, compared to the use of a sapphire substrate. This reduces a warp or deformation created by temperature change in the substrate having a layer grown thereon, and effectively lowers an amount of dislocations or other defects in the nitride layer, which otherwise would be induced by large deformation.

Since, as shown in Table 2, the borides $XB_2$ show relatively high electrical conductivity enough to provide a substrate with an connecting electrode to electrically connect the nitride layers on the substrate to an outer lead. The electrode may be attached to the substrate on not only its top major surface for forming the layers thereon, but also the opposite surface to the top major surface. Particularly, the formation of the electrode to the rear major surface is effective to make the device more compact because there is no need to etch and cut the semiconducting nitride layers in order to form a particular place on which an electrode should be applied. Further, the substrate in the present invention may be used as an connecting electrode, i.e., lead wires may directly be connected to some area of a surface of the substrate.

Embodiment 1

For producing a boride crystal including Ti and/or Zr, known processes of producing a sing crystal can be used, such as the flux melting process using an aluminum flux, the zone melting process by lamp focusing heating, the induction zone melting, and especially, the induction zone melting is preferable because of electric conductivity of the borides. Although these borides have very high melting temperatures of 3050° C.±5° C. for $ZrB_2$ and 2790° C.±5° C. for $TiB_2$, the borides are electrically conductive enough to apply induction heating to melt the nitrides.

Comfortably, these borides are easily crystallized into a large crystal grain during solidification from its molten state. In the process of the floating zone melting of a elongated material of $XB_2$, a locally heated and melted part of the material is moved slowly along the longitudinal direction of the material, and then the molten part, or zone, is cooled gradually to crystallize. During cooling the molten zone, a particular crystal grain among many grains created at the beginning of solidifying can crystallize fast and preferentially into a large single crystal.

A nitride single crystal so produced is cut out into blocks such that the cut surface of the blocks should be a desired crystal plane such as plane (0001). Then, in order to provide the plates as substrates for growing nitride layers, the crystal plane on the plate surface is determined precisely, for example, by using an X-ray diffraction technique. Actually, cutting of the surfaces and determining of the crystal orientations are repeated until the cut surface of the single crystal is precisely matched to plane (0001) of the crystal, while observing diffracting patterns from the X-ray diffraction method.

The boride crystal is ground and polished with diamond abrasive because of high hardness of the crystal. The method of grinding is preferable a wet grinding process using a diamond abrasive wheel having a grain size range of 400 mesh to 1000 mesh according to JIS. The gain size rougher than 400 mesh is not desirable because the rough grained abrasive increases a risk of producing cracks inside the single crystal. On the other hand, the finer grain size than 1000 mesh is not practical because of the lower grinding speed. Other abrasives than diamond is undesirable because the high efficiency of grinding can not be obtained only to make the cut surfaces smooth like a mirror.

In the present invention, in further detail, the cut surface of the boride crystal is measured by the θ-2θ method of the X-ray diffraction technique and polished by the abrasive, the measuring and polishing being repeated to meet the cut surface precisely with a particular crystallographic plane such as plane (0001). The finishing processes include determining a diffraction angle of X ray diffracted from a cut surface of the boride crystal, and calculating an angle and orientation of the cut surface with respect to the nearest plane (0001), for example, of the crystal. Further, the processes include recutting the cut surface according to the determined angle and orientation so as to approach the plane orientation of the cut surface to the plan (0001) as precisely as possible. These processes of measuring X-ray diffraction from the cut surface of the crystal and recutting the cut surface are in return repeated until a Laue backside pattern of Plane (0001) is clearest on diffracting a X-ray from the recut surface of the crystal. FIG. 3 shows a Laue backside pattern of a X ray diffracted from plane (0001) of a $ZrB_2$ single crystal.

Thus, the single crystal having the surface precisely determined to have plane (0001) is sliced into a number of thin substrates each having a surface parallel to plane (0001). The step of slicing of substrates may use a bandsaw.

The substrates are polished on the determined surface and then finished into a mirror surface. To polish the substrates, diamond abrasive may be used and the abrasive preferably may have a grain size under 3 $\mu$m, the grain size over 3 $\mu$m giving risk of surface defect to the substrate.

In the finishing step for the mirror surface, the substrates may be chemically polished in the solution of potassium hydroxide in water. It is preferable that, to smooth the surface parallel to plane (0001), the potassic solution be set to a temperature of 30° C. or less and to the range of pH 8.0 to 80.5. If the solution outside is outside said pH range, selective etching would occur on the surface of plane (0001), producing numerous projections, each less than 1 $\mu$m high and 3–20 $\mu$m in diameter, on the surface. In the case of the surface having other planes than plane (0001), the chemical polishing technique with a larger range of pH may avoid so selective, defective etching, obtaining a very smooth major surface on the substrate.

The single crystal substrates of $ZrB_2$ are washed with organic solvent, such as acetone or methanol, and rinsed with water, preferably, at a temperature of 30° C. or less to avoid formation of an oxide layer coating on the surface of the substrate.

EXAMPLE 1

Samples of $ZrB_2$ and $TiB_2$ were prepared and tested in the followings, to determine crystallographic and thermal properties of those borides.

The samples of bar-like single crystals $ZrB_2$ and $TiB_2$ were prepared by a floating zone melting process to a dimension of 10 mm in diameter and 60 mm in length, and, after determining Plane (0001) for each sample, they were used to measure thermal expansion coefficient and thermal conductivity in a direction perpendicular to axis <0001>.

A specimen was cut out of each of the samples into a bar having a length of 9 to 16 mm along in a direction perpendicular to axis <0001>. In measuring thermal expansion, the specimen was placed in a thermal analyzer (type TAS-200 manufactured by RIGAKU Co. Ltd.).

In measuring thermal conductivity, the specimen prepared in the same way was used by applying a laser-flash method (using the apparatus of type TC-7000 by SHINKU-RIKO Co. Ltd.).

A lattice constant of each sample was determined by X-ray diffraction method (using the diffractometer of type PHLIPS PW3050).

Table 3 shows the resulting data of thermal expansion coefficients, thermal conductivities and lattice constants of single crystals of $ZrB_2$ and $TiB_2$, and, for comparison, lists the published date of polycrystalline borides by "Illustrated Crystallochemistry of Fine Ceramics", Agne Technical Center Co., Tokyo. From the date in Table 3, it is found that the thermal data of $ZrB_2$ and $TiB_2$ are significantly different between a single crystal and a polycrystal.

TABLE 3

| | $ZrB_2$ | | $TiB_2$ | |
| --- | --- | --- | --- | --- |
| | measured single crystal | poly-crystal | measured single-crystal | poly-crystal |
| expansion coefficient $10^{-6}$/° C. | 8.3058 | 6.8 | 6.758 | 5.5 |
| thermal conductivity (cal/cm · sec · ° C.) | 0.32 | 0.058 | 0.18 | 0.01 |
| lattice constant (Å) | 3.1696 | 3.1670 | 3.0303 | 3.0245 |

Embodiment 2

The semiconductor device of the present invention includes the substrate of a single crystal of $XB_2$, wherein X is Ti or Zr or their solid solution and the substrate has a major surface parallel to a particularly crystallographic plane, such as plane (0001), and at least one or more semiconducting layers of nitride which is epitaxially grown on the major surface of the substrate. The semiconducting layer is constituted by a nitride containing one or more elements of Ga, Al, In and B. Also, a plurality of semiconducting layers of such a nitride may be formed by laminating another semiconducting layer over other on the major surface of the substrate. In the semiconductor device of the present invention, particularly, a GaN-based grown layer may be adapted to the surface of plane (0001) of the $XB_2$-based substrate because of high lattice coherency of the substrate to the above GaN-based grown layer. The following shows a method of producing a semiconductor device using GaN-based grown multilayers on the substrate of $ZrB_2$.

The method of growing a semiconducting layer can use any of the techniques of molecular beam epitaxy (MBE), metal organic vapor phase epitaxy (MOVPE), hydride vapor phase epitaxy (HVPE), and sublimation, and a combination of those techniques. For example, in an earlier step of forming each layer, the MBE technique may be used for growing a layer while controlling the surface condition of the layer and in the later step, the HVPE may be used for growing the layer thicker because of high speed growth.

Figure 4:
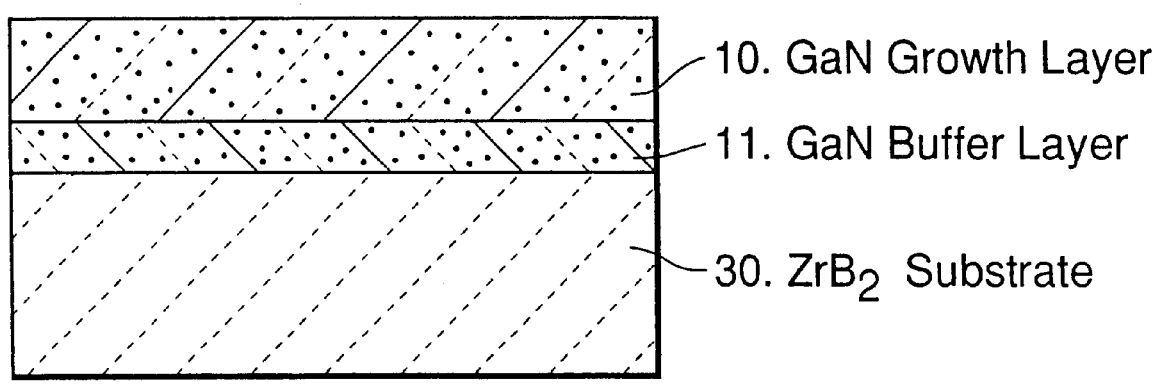
FIG. 4 shows a longitudinally cross-sectional view of the arrangement of a GaN worth layer on a $ZrB_2$ substrate.

In the present invention, the first layer such as GaN layer may be formed directly on the substrate without any buffer layer. However, as shown in FIG. 4, a buffer layer 11 may be formed on the major surface of the substrate 30, on which the layer 11 is grown. Such a buffer layer may be composed of GaN, ZnO, BN, SiC or the like.

The semiconductor device of the present invention is wisely applicable to devices, using one or more semiconducting layers of GaN or other semiconducting nitrides, for example, a light emission device, a laser diode, a transistor, a triac, a thyristor. The semiconductor devices are effectively capable of exhibiting properties of good conductivity and high heat radiation of the substrate and high lattice coherency between the growth layer and the substrate.

EXAMPLE 2

The example of the growing of the GaN layer on the surface of plane (0001) of a $ZrB_2$ substrate is shown as follows. The single crystal of ZrB$_2$ was prepared by floating zone melting and sliced into substrate having a major surface of plane (0001). A GaN layer was grown on the major surface of the substrate by using MBE technique under a vacuum where a Ga molecular beam and activated nitrogen in a high frequency exited plasma cell were provided onto the surface of the ZrB$_2$ substrate heated up to 800° C., to grow a layer thereon. The Ga beam was supplied at a pressure of 10–2 Pa with a nitrogen flow of 0.5 Sccm and power supply of 400 W.

Figure 5:
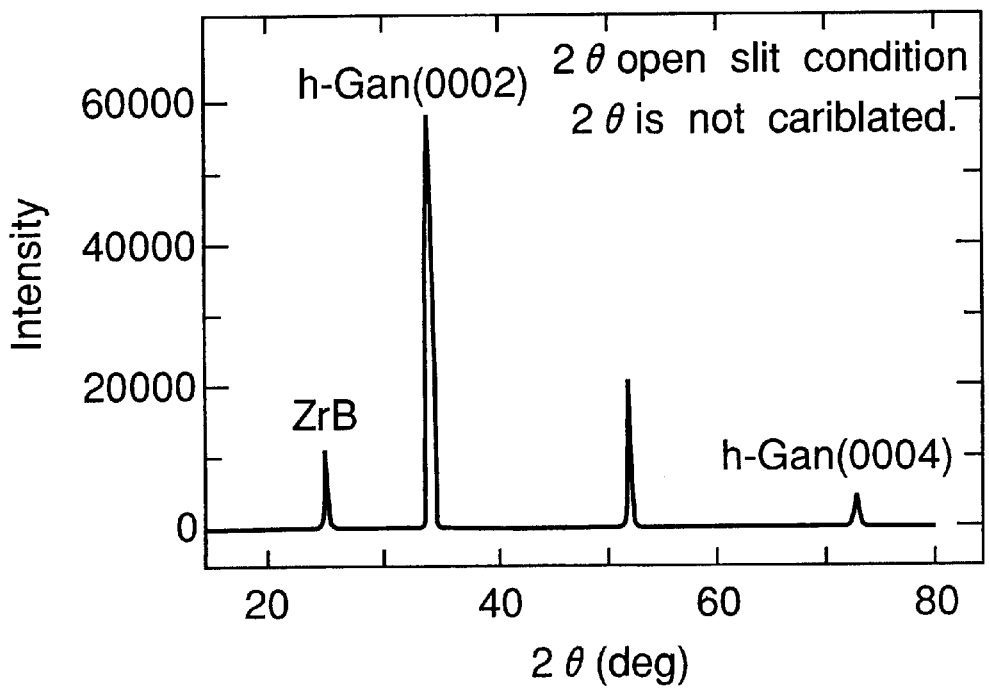
FIG. 5 shows a X-ray diffraction chart of GaN grown layer on a $ZrB_2$ substrate where the lateral axis shows a diffraction angle and the longitudinal axis shows a diffracted X-ray intensity.

FIG. 5 shows a chart of X-ray diffraction to the structure of the GaN-layered ZrB$_2$ substrate. As the diffraction of plane (0001) of both layer and substrate was measured through the θ-2θ method, and the X-ray peeks only from planes (0002) and (0004) were observed, indicating that the GaN layer was grown epitaxially from the ZrB$_2$ substrate.

Figure 6:
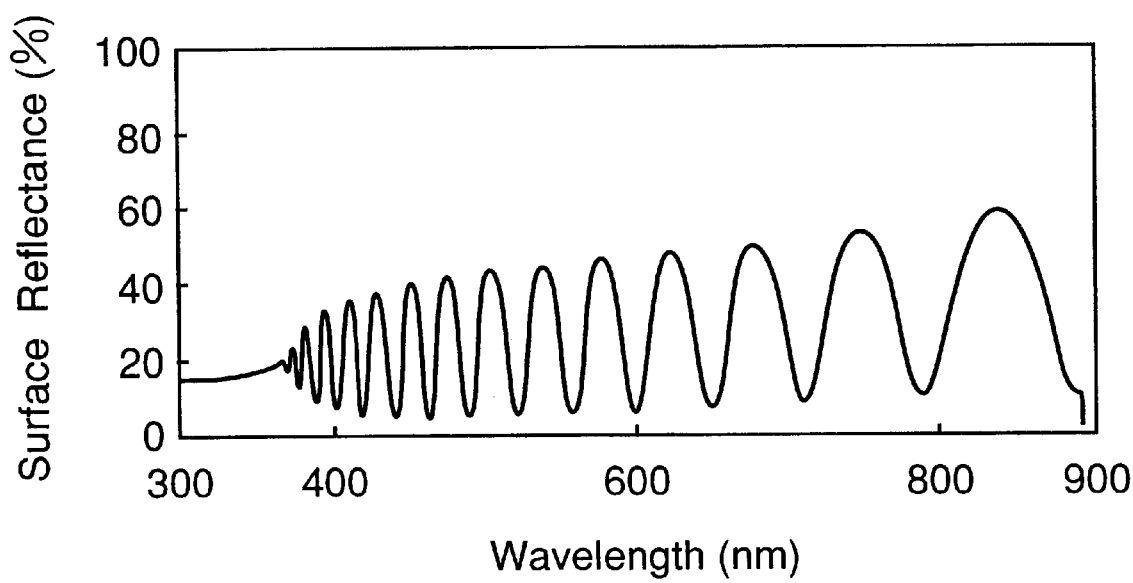
FIG. 6 shows a spectrum chart of deflected ray on the surface of a GaN growth layer on a $ZrB_2$ substrate where the lateral axis shows a wavelength of light and longitudinal axis is a light reflectance of the surface of the GaN grown layer.

FIG. 6 shows a spectrum distribution of surface refledctance from the GaN-layered ZrB$_2$ substrate, indicating definite periodic modulation of the reflectance spectrum due to critical optical interference between the GaN layer and the ZrB$_2$ substrate, this interference behavior reflecting the precise flatness of the layer and the smoothness of the interface therebetween. As shown in FIG. 6, the wavelength at which the periodic modulation diminishes is 368.5 nm, corresponding to an optical band gap at room temperature, which exhibits high optical property of the GaN layer epitaxially formed on the ZrB$_2$ substrate.

Embodiment 3

Figure 7:
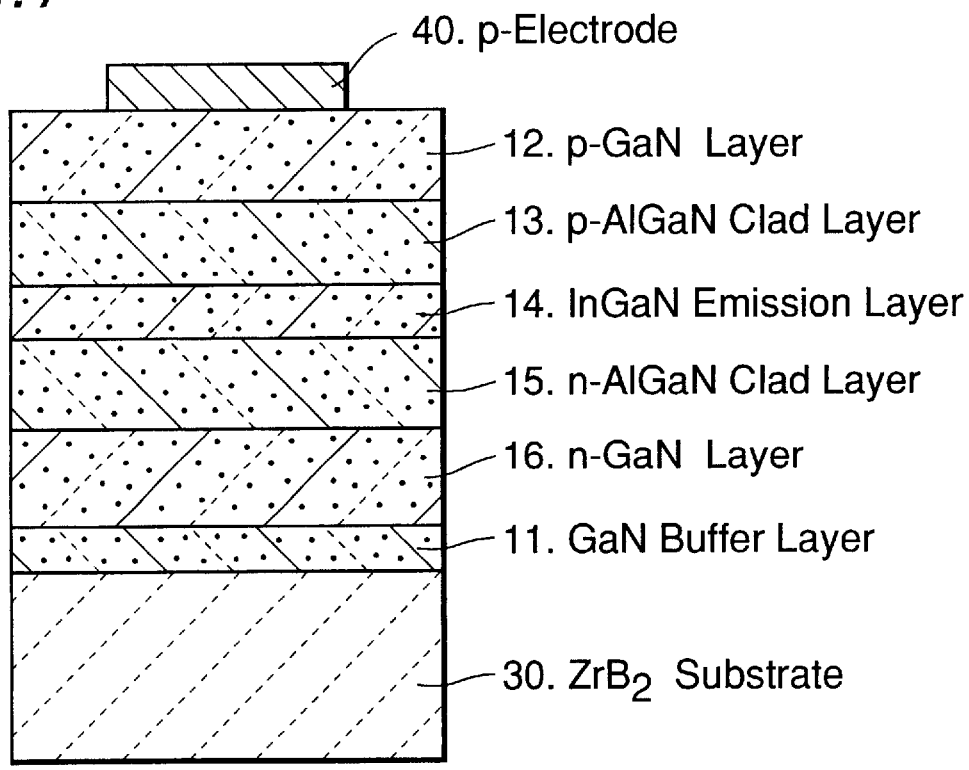
FIG. 7 shows a cross-sectional view of a GaN based light emission diode fabricated on a $ZrB_2$ substrate according to the embodiment of the present invention.
Figure 8:
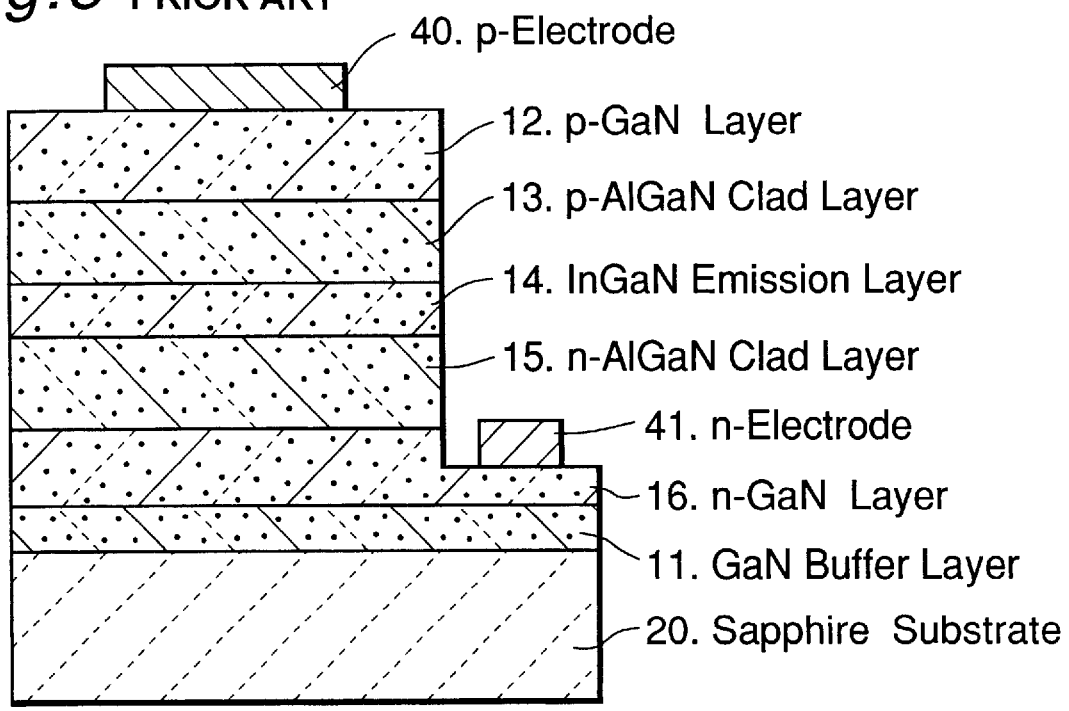
FIG. 8 shows a cross-sectional view of a prior art GaN based light emission diode fabricated on a sapphire substrate.

FIG. 7 shows a vertically cross-sectional view of a light emission diode having a GaN-based double-hetero p-n multilayer structure on a ZrB$_2$ substrate. In this light emission diode, the GaN-based multilayer includes, on a GaN buffer layer 11 on the substrate 30, a Si-doped n-GaN layer 16, a Si-doped n-AlN clad layer 15, a Si-and Zn-doped n-InGaN light emission layer 14, a Mg-doped p-AlGaN clad layer 13 and a Mg-doped p-GaN layer 12, in this order. In this diode, because the substrate itself, electrically conductive, is used for an electrode for electrical connecting the multilayer to an outer lead (not shown).

Thus, the use of a ZrB$_2$ substrate for a GaN-based semiconductor device shows the following advantages. The electrode structure in the device can be simplified by using the substrate as an electrode because of its conductivity. The electric and optical performance of the semiconductor device can be improved because of GaN growth layers each having high coherency to the ZrB$_2$ substrate and having high crystallinity with a very low level of lattice defects. Further, the light emission device can be high in light emission efficiency, i.e., the light from a light emitting layer can be reflected to the opposite side to the substrate because of metallic gloss with no transmittency of the ZrB$_2$ and TiB$_2$ crystal substrateas.

Furthermore, the heat radiation property of the semiconductor device can be improved by high thermal conductivity of the ZrB$_2$ and TiB$_2$ crystal substrates.

What is claimed is:

1. A substrate for forming a semiconducting layer to grow the semiconducting layer on a major surface thereof, wherein the substrate comprises a single crystal of a chemical formula of XB$_2$ where X contains at least one of Ti and Zr.

2. A substrate for forming a semiconducting layer to grow the semiconducting layer on a major surface thereof, wherein the substrate comprises a single crystal of a chemical formula of XB$_2$ where x contains at least one of Ti and Zr, wherein the major surface is substantially parallel to plane (0001) of the single crystal.

3. A substrate for forming a semiconducting layer to row the semiconducting layer on a major surface thereof; wherein the substrate comprises a single crystal of a chemical formula of XB$_2$ where x contains at least one of Ti and Zr, wherein the single crystal is a solid solution containing impurities of not more than 5%.

4. The substrate according to claim 3, wherein at least one of the impurities is one selected from Cr, Hf, V, Ta and Nb.

5. The semiconductor device comprising the substrate according to claim 1 and a semiconducting layer which is grown epitaxially on the substrate.

6. A semiconductor device comprising:
   a substrate for forming a semiconducting layer to grow the semiconducting layer on a major surface thereof, wherein the substrate comprises a single crystal of a chemical formula of XB$_2$ where x contains at least one of Ti and Zr; and
   a semiconducting layer which is grown epitaxially on the substrate,
   wherein the semiconducting layer comprises a nitride semiconductor of a chemical formula of ZN where Z is at least one of gallium, aluminum and indium and boron.

7. A semiconductor device comprising:
   a substrate for forming a semiconducting layer to grow the semiconducting layer on a major surface thereof, wherein the substrate comprises a single crystal of a chemical formula of XB$_2$ where x contains at least one of Ti and Zr; and
   a semiconducting layer which is grown epitaxially on the substrate,
   wherein the semiconducting layer is formed on a buffer layer which is formed on the substrate.

8. The semiconductor device according to claim 7, wherein the buffer layer is an amorphous or crystalline phase of a nitride containing at least one of gallium and aluminum.

9. A semiconductor device comprising:
   a substrate for forming a semiconducting layer to grow the semiconducting layer on a major surface thereof, wherein the substrate comprises a single crystal of a chemical formula of XB$_2$ where x contains at least one of Ti and Zr; and
   a semiconducting layer which is grown epitaxially on the substrate,
   wherein one or more connection electrodes are attached on the substrate.

10. A semiconductor device comprising:
   a substrate for forming a semiconducting layer to grow the semiconducting layer on a major surface thereof wherein the substrate comprises a single crystal of a chemical formula of XB$_2$ where x contains at least one of Ti and Zr; and
   a semiconducting layer which is grown epitaxially on the substrate,
   wherein the semiconductor device is a light emission diode including a light emission layer based on gallium nitride therein.

* * * * *